United States Patent
Kaiya et al.

[11] Patent Number: 6,005,287
[45] Date of Patent: *Dec. 21, 1999

[54] SEMICONDUCTOR DEVICE, AND LEAD FRAME USED THEREFOR

[75] Inventors: Yuiti Kaiya; Takehiko Takahashi; Takemitu Sato, all of Yamagata, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/743,047

[22] Filed: Nov. 4, 1996

[30] Foreign Application Priority Data

Nov. 24, 1995 [JP] Japan ..................................... 7-305332

[51] Int. Cl.$^6$ ......................... H01L 23/495; H01L 23/48
[52] U.S. Cl. ......................... 257/674; 257/666; 257/667; 257/668; 257/673; 257/734; 257/798
[58] Field of Search .................................. 257/666, 667, 257/668, 673, 734, 798

[56] References Cited

U.S. PATENT DOCUMENTS 4,209,355  6/1980  Burns ..................................... 257/673
5,343,072  8/1994  Imai et al. ............................. 257/666

FOREIGN PATENT DOCUMENTS

| 48-38070 | 6/1973 | Japan . |
| 60-241241 | 11/1985 | Japan . |
| 62-35549 | 2/1987 | Japan . |
| 2-33956 | 2/1990 | Japan . |
| 3-21854 | 3/1991 | Japan . |
| 4-93005 | 3/1992 | Japan . |
| 2-253298 | 5/1992 | Japan ..................................... 257/666 |
| 3-136751 | 8/1992 | Japan ..................................... 257/666 |

*Primary Examiner*—Carl Whitehead, Jr.
*Assistant Examiner*—Matthew E. Warren
*Attorney, Agent, or Firm*—Young & Thompson

[57] ABSTRACT

A semiconductor device in which a flat inner lead is connected to a semiconductor pellet so that a side edge of the inner lead is connected to the semiconductor pellet. The lead includes a constricted portion that is twisted so that the side edge faces a surface of the pellet to which the lead is connected. A lead frame is arranged so that the side edge can be twisted into position.

10 Claims, 5 Drawing Sheets

SEMICONDUCTOR DEVICE, AND LEAD FRAME USED THEREFOR

BACKGROUND OF THE INVENTION

1. Field of the Invention

The present invention relates to a semiconductor device, a method of manufacturing the same, and a lead frame used therefor and, more particularly, to a technique of connecting an inner lead to a semiconductor pellet without using any bonding wire.

2. Description of the Prior Art

Figure 1:
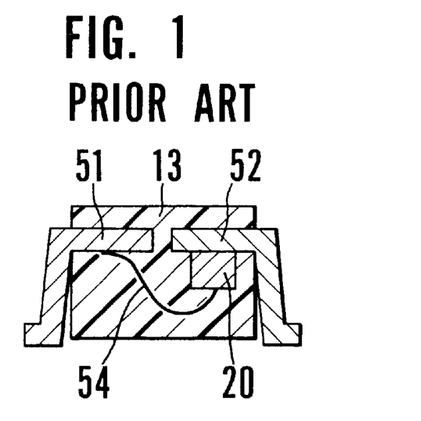
FIG. 1 is a schematic longitudinal sectional view showing a conventional semiconductor device formed by a wire connection method.

A technique most popularly used to connect an inner lead to a semiconductor pellet is a wire connection method. As shown in FIG. 1, a semiconductor pellet 20 is mounted and fixed on an inner lead 52. The pellet electrode (not shown) of the semiconductor pellet 20 is connected to an inner lead 51 by a bonding wire 54, i.e., a metal thin wire, and the resultant structure is encapsulated with a resin material 13.

In this connection method, a large area must be ensured for the inner lead to which the bonding wire 54 is connected, i.e., the inner lead 51 such that wire bonding is enabled, and a size reduction is difficult to attain. Additionally, since a noble metal such as Au is often used for the bonding wire 54 because of restrictions on various necessary solid state properties, the material cost increases. Furthermore, the bonding wire 54 is a thin wire and therefore has a poor mechanical strength regardless of its material. In an exposed state, the bonding wire 54 easily deforms or ruptures. Hence, measures for protecting the bonding wire must be taken in the manufacturing process. In addition, when an overcurrent flows to a semiconductor device manufactured using this method, the wire tends to fuse and rupture because of resistance heating of the wire, so the semiconductor device cannot be used under such conditions. That is, a problem of surge resistance arises.

Figure 2:
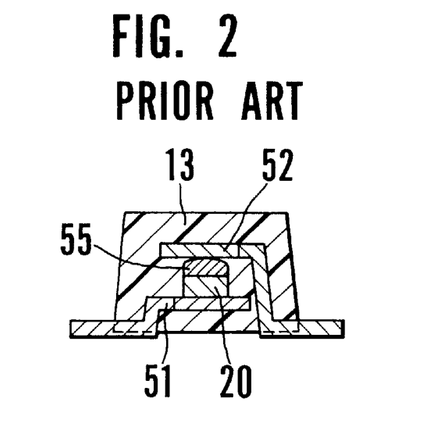
FIG. 2 is a schematic longitudinal sectional view showing another conventional semiconductor device in which inner leads are connected to both surfaces of a semiconductor pellet.

As described above, the wire connection method has a lot of restrictions and problems. To solve some of these problems, Japanese Unexamined Utility Model Publication No. 3-21854 discloses a technique shown in FIG. 2. Referring to FIG. 2, the terminal portion of an inner lead 51 is made to overlap that of an inner lead 52. A semiconductor pellet 20 is inserted between the inner lead 51 and the inner lead 52 and connected to the two inner leads, and the resultant structure is encapsulated with a resin material 13.

When the technique disclosed in Japanese Unexamined Utility Model Publication No. 3-21854 shown in FIG. 2 is used, the semiconductor device can be made compact, unlike the wire connection method. In addition, without any bonding wire, the process of encapsulating the resultant structure with a molten synthetic resin can be completed within a short period of time.

However, to make the inner lead 51 overlap the inner lead 52, at least two lead frames are needed to form the respective leads. This results in a larger material cost for the lead frame than that of the wire connection method. In addition, when the semiconductor pellet 20 is to be inserted, the inner leads 51 and 52 and the semiconductor pellet 20 interfere with each other. The semiconductor pellet 20 tends to break by chipping. Furthermore, the bonding interface of the inner lead 52 is not always parallel to the electrode of the semiconductor pellet 20. Therefore, a process of forming a projecting electrode on the semiconductor pellet or a projecting bonding surface on the inner lead 52, or a process of inserting a bonding medium 55 between the electrode of the semiconductor pellet 20 and the inner lead 52 is necessary. This complicates the manufacturing process and also makes automation difficult, resulting in an increase in manufacturing cost.

Figure 3:
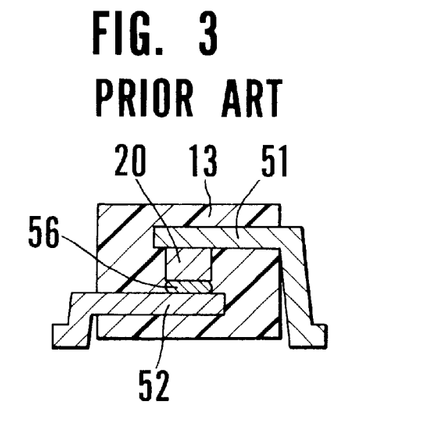
FIG. 3 is a schematic longitudinal sectional view showing still another conventional semiconductor device in which inner leads are connected to both surfaces of a semiconductor pellet.

Another prior art as shown in FIG. 3 is disclosed in Japanese Unexamined Patent Publication No. 4-93055. Referring to FIG. 3, one major surface of a semiconductor pellet 20 is bonded to the terminal portion of an inner lead 51, thereby mounting the semiconductor pellet 20. Thereafter, the terminal portion of an inner lead 52 is connected to a pellet projecting electrode 56 provided on the other major surface of the semiconductor pellet 20, and the resultant structure is encapsulated with a resin material 13.

As in the prior art shown in FIG. 2, in the prior art shown in FIG. 3 as well, the semiconductor device can be made compact, unlike the wire bonding method. In addition, the surge resistance increases. In the prior art shown in FIG. 3, the semiconductor pellet hardly breaks. However, a process of forming the pellet projecting electrode 56 is necessary, and as in the prior art shown in FIG. 2, two lead frames are needed to overlay the leads, resulting in an increase in material cost for the lead frames. Therefore, the manufacturing cost of the semiconductor device increases as a whole.

Figure 4:
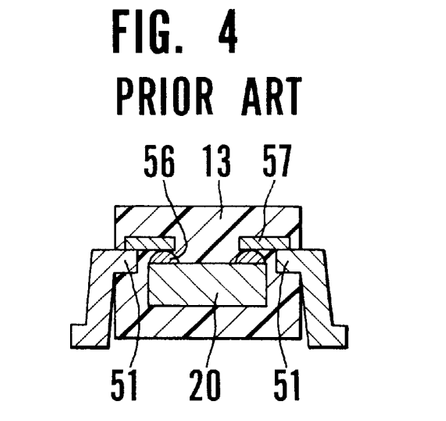
FIG. 4 is a schematic longitudinal sectional view showing still another conventional semiconductor device in which inner leads are connected to one surface of a semiconductor pellet through a flat lead.

As a technique of solving some of the above problems in the prior arts shown in FIGS. 2 and 3, a semiconductor device shown in FIG. 4 is disclosed in Japanese Unexamined Patent Publication No. 60-241241. Referring to FIG. 4, the distal end portions of inner leads 51 of a lead frame which is covered with a metal suitably used as solder are connected to a pellet projecting electrode 56 of a semiconductor pellet 20 through a flat lead 57, and the resultant structure is encapsulated with a resin material 13.

Since only one lead frame is used for the semiconductor device shown in FIG. 4, an increase in material cost for the lead frame can be prevented. However, a process of connecting the pellet projecting electrode 56 and the inner leads 51 of the lead frame through the flat lead 57 is necessary. This makes the manufacturing process more complex than that in the prior art shown in FIG. 2 or 3 and also makes automation difficult. In addition, since the flat lead 57 must be prepared, the number of members increases to result in an increase in material cost. Furthermore, a process of forming a pellet projecting electrode to obtain the projecting electrode 56 or forming a projecting bonding portion on the flat lead 57 is needed. Therefore, the manufacturing cost increases as a whole.

Figure 5A:
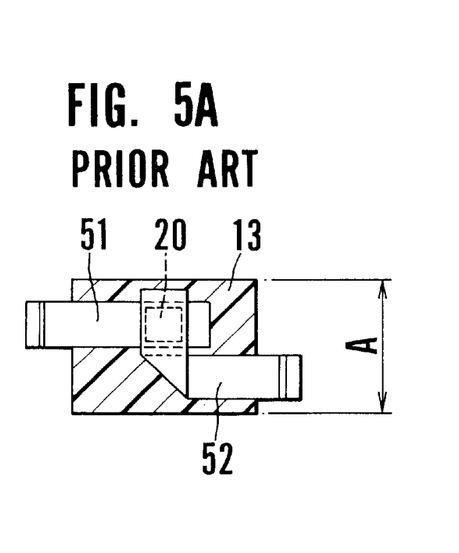
FIGS. 5A and 5B are a schematic horizontal sectional view and a schematic longitudinal sectional view, respectively, showing still another conventional semiconductor device in which inner leads extending from one lead frame are connected to both surfaces of a semiconductor pellet.
Figure 5B:
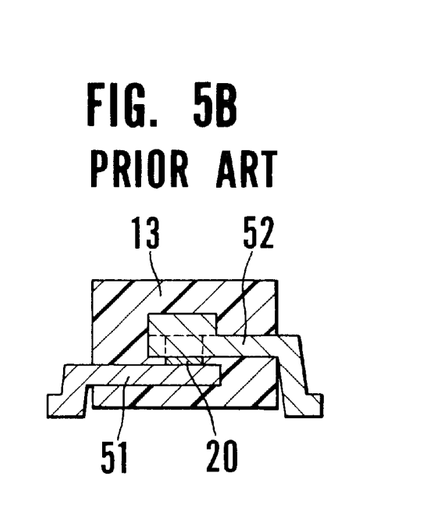

A semiconductor device shown in FIGS. 5A and 5B is disclosed in Japanese Unexamined Patent Publication No. 62-35549. FIG. 5A is a horizontal sectional view, and FIG. 5B is a longitudinal sectional view. This semiconductor device solves some of the problems of the semiconductor devices shown in FIGS. 1 to 4. One lead frame is used in this device. The distal end portion of an inner lead 52 is bent sideways. A semiconductor chip 20 is mounted between the distal end portion of the inner lead 52 and that of an inner lead 51, and the resultant structure is encapsulated with a resin material 13.

In the semiconductor device shown in FIGS. 5A and 5B, the number of members decreases because one lead frame is used. However, plating must be performed for both the upper and lower surfaces of the lead frame, resulting in an increase in plating cost, as compared to the above-described prior arts. In addition, since the distal end portion of the inner lead 52 is bent, a width A of the semiconductor device after encapsulation cannot be decreased, and a large mounting area is required. Furthermore, since a process of bending and fully inverting the distal end portion of the inner lead 52 sideways is necessary, the lead frame transfer speed in the manufacturing process of the semiconductor device must be reduced, resulting in a decrease in productivity.

Figure 6:
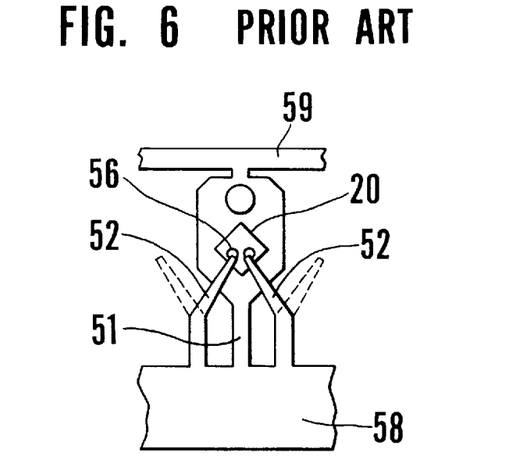
FIG. 6 is a schematic plan view showing still another conventional semiconductor device in which inner leads extending from one lead frame are connected to one surface of a semiconductor pellet.

A similar semiconductor device as shown in FIG. 6 is disclosed in Japanese Unexamined Patent Publication No. 48-38070 in which one lead frame is used, and the distal end portion of an inner lead is bent. Referring to FIG. 6, the lead frame is constituted by support frames 58 and 59 and inner leads 51 and 52. A semiconductor chip 20 is mounted on an island, i.e., a wide portion at the distal end of the inner lead 51. The distal end portions of the inner leads 52 are bent and fully inverted sideways and connected to solder bumps serving as pellet projecting electrodes 56 of the semiconductor pellet 20.

In the semiconductor device shown in FIG. 6, the number of members is small because only one lead frame is used as in the device shown in FIGS. 5A and 5B. However, the solder bumps 56 must be formed on the semiconductor pellet 20 in advance. In addition, plating must be performed for both the upper and lower surfaces of the lead frame. This increases the manufacturing cost as a whole. Furthermore, in mounting the semiconductor pellet 20 on the inner leads 51 and 52, the inner leads 52 are bent and connected to the solder bumps 56 of the semiconductor pellet 20 before the lower surface portion of the semiconductor pellet 20 is fixed on the wide island of the inner lead 51. Since this operation is performed before the semiconductor pellet 20 is fixed to the inner lead 51, misalignment tends to take place between the semiconductor pellet 20 and the distal end portions of the inner leads 52, resulting in a bonding position misalignment of the inner leads 52. As in the prior art shown in FIGS. 5A and 5B, the lead frame transfer speed must be reduced.

Figure 7A:
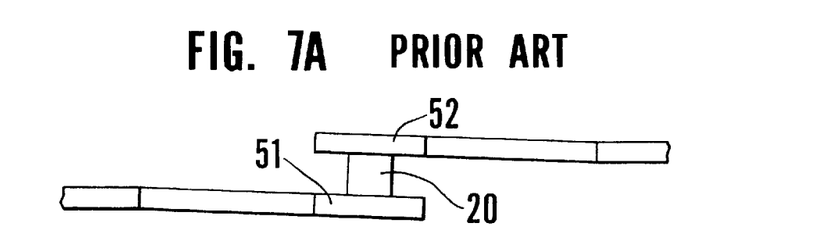
FIG. 7A is a schematic side view showing still another conventional semiconductor device in which inner leads extending from one lead frame are connected to both surfaces of a semiconductor pellet.
Figure 7B:
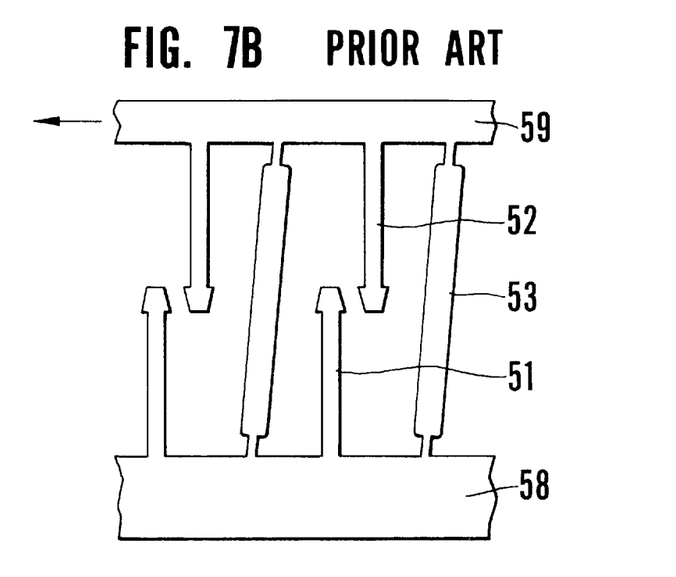
FIG. 7B is a schematic plan view showing the main portion of the lead frame used for the semiconductor device shown in FIG. 7A.

As another prior art of this type, a semiconductor device shown in FIGS. 7A and 7B is disclosed in Japanese Unexamined Patent Publication No. 2-33956. The inner leads shown in FIG. 7B extend inward from support frames 58 and 59, and portions near the centers of them along the longitudinal direction serve as inner leads 51 and 52, respectively. The support frames 58 and 59 are connected through tie bars 53. A semiconductor pellet 20 is mounted on a wide portion at the distal end of one inner lead, e.g., the inner lead 51. The inner lead 52 is lifted together with the support frame 59 relative to the support frame 58 and the inner lead 51 (displaced in the direction coming out of the page of FIG. 7B), and at the same time, shifted in a direction indicated by an arrow in FIG. 7B relative to the support frame 58 and the inner lead 51. With this operation, the distal end portion of the inner lead 52 overlaps (overhangs) the semiconductor pellet 20 and is connected to the surface pellet electrode of the semiconductor pellet 20, as shown in FIG. 7A.

This semiconductor device can be made compact, and the lead frame transfer speed during the manufacturing process of the semiconductor device can be increased. As a matter of fact, however, with the planar shape shown in FIG. 7B, it is difficult to horizontally move the upper half portion of the lead frame relative to the lower half portion in the direction indicated by the arrow in FIG. 7B to attain a predetermined displacement and make the semiconductor pellet overlap the distal end portion of the inner lead 52 with good reliability. In addition, to selectively connect the inner lead 52 to the surface electrode of the semiconductor pellet 20, a bump electrode must be formed, or a projecting bonding portion must be formed on the inner lead 52. Furthermore, plating must be performed for both the upper and lower surfaces of the lead frame. This increases the member of manufacturing steps and the plating cost.

As described above, the prior arts have unique problems, respectively.

More specifically, the semiconductor device shown in FIG. 1 can hardly be made compact. The material cost for the bonding wire increases. The bonding wire tends to deform or rupture. The surge resistance of the semiconductor device in use is decreased.

In the semiconductor device shown in FIG. 2, the material cost of the lead frame increases. In the assembly process, the semiconductor pellet is susceptible to chipping and scratching. A process for forming a projecting electrode on the semiconductor pellet or a projecting bonding interface on the inner lead, or a process for inserting a bonding medium is needed. This complicates the manufacturing process and makes automation difficult to accomplish.

In the semiconductor device shown in FIG. 3, to form a projecting pellet electrode, the number of manufacturing steps increases. In addition, the material cost for the lead frame increases.

In the semiconductor device shown in FIG. 4, since the flat lead is used, the numbers of manufacturing steps and members increase. To form a projecting pellet electrode or a projecting bonding portion on the flat lead, the number of manufacturing steps increases.

In the semiconductor device shown in FIGS. 5A and 5B, since plating must be performed for both the upper and lower surfaces of the lead frame, the plating cost increases. The width of the semiconductor device can hardly be reduced. The lead frame transfer speed is low.

In the semiconductor device shown in FIG. 6, to form the solder bump on the semiconductor pellet, the number of manufacturing steps increases. Since plating must be performed for both the upper and lower surfaces of the lead frame, the plating cost increases. The lead frame transfer speed is low. Misalignment tends to occur between the semiconductor pellet and the distal end portion of the inner lead.

In the semiconductor device shown in FIGS. 7A and 7B, it is difficult to make the semiconductor pellet overlap the distal end portion of the inner lead. A process for forming a bump electrode or a projecting bonding portion on the inner lead is necessary. Since plating must be performed for both the upper and lower surfaces of the lead frame, the plating cost increases.

SUMMARY OF THE INVENTION

The present invention has been made to solve the above problems of the prior arts, and has as its first object to provide a semiconductor device which can be made compact, reduces cost without using any wire to connect a semiconductor pellet to an inner lead, improves the reliability during the manufacturing process and the surge resistance in use, reduces the material cost for a lead frame, needs no special process of forming a projecting portion on the connecting portion, reduces the plating cost, increases the lead frame transfer speed, prevents the semiconductor pellet from being flawed during the assembly process, prevents misalignment between the semiconductor pellet and the distal end portion of the inner lead, and facilitates automation of the manufacturing process.

It is the second object of the present invention to provide an effective manufacturing method of obtaining the above semiconductor device.

It is the third object of the present invention to provide an effective lead frame applicable to the above semiconductor device or the above method of manufacturing the semiconductor device.

In order to achieve the first object, according to the first aspect of the present invention, there is provided a semiconductor device in which a flat inner lead is connected to a semiconductor pellet, wherein a side surface of the inner lead is connected to the semiconductor pellet. The inner lead has a constricted portion at a predetermined position such that the inner lead can be twisted at the constricted portion. Preferably, a projecting portion is formed on a side surface of a distal end portion of the inner lead connected to the semiconductor pellet. In addition, a recessed portion is preferably formed on a flat surface of a distal end portion of the inner lead.

In order to achieve the second object, according to the second aspect of the present invention, there is provided a method of manufacturing a semiconductor device, comprising the steps of mounting a semiconductor pellet on a first inner lead of a lead frame, supplying a low-melting conductive material, preferably solder, on a distal end portion of a second inner lead of the lead frame, twisting the second inner lead to make a side surface of the distal end portion oppose a pellet electrode of the semiconductor pellet, and performing a heat treatment at a temperature higher than a melting point of the solder to connect the distal end portion of the second inner lead to the pellet electrode through the solder. There is also provided a method of manufacturing a semiconductor device, comprising the steps of mounting a semiconductor pellet on a first inner lead of a lead frame, twisting a second inner lead of the lead frame to make a side surface of a distal end portion of the second inner lead oppose a pellet electrode of the semiconductor pellet, and immersing the distal end portion of the second inner lead in a melt tank of a low-melting conductive material, preferably a solder melt tank, to connect the distal end portion to the pellet electrode through the solder.

In order to achieve the third object, according to the third aspect of the present invention, there is provided a lead frame comprising a first inner lead having an island on which a semiconductor pellet is to be mounted, and a second inner lead connected to a pellet electrode of the semiconductor pellet, wherein a projecting portion is formed on a side surface of a distal end portion of the second inner lead opposing the island.

In the third aspect, a constricted portion is preferably formed at a predetermined portion of the second inner lead. There is also provided a lead frame comprising a first support frame, a second support frame separated from the first support frame at a predetermined interval and extending parallel to the first support frame, a first lead integrally connected to the first support frame and having a first outer lead and a first inner lead with an island formed at a distal end portion, and a second lead integrally connected to the second support frame and having a second outer lead and a second inner lead, wherein the second inner lead comprises a first portion extending from the second outer lead side to the first support frame, a second portion bent from an end portion of the first portion to extend parallel to the first and second support frames, and a third portion bent from an end portion of the second portion to extend toward the first support frame so as to oppose the island, a constricted portion is formed at a predetermined portion of the first portion, and a projecting portion projecting toward the island is formed on a side surface of the third portion, which opposes the island. Preferably, one of a recessed portion and a through hole is formed in a flat surface of the third portion near the projecting portion. In addition, plating may be performed for one flat surface of the third portion at which the projecting portion is formed.

According to the above-described aspects of the present invention, the inner lead is directly connected using no bonding wire but a bonding material such as solder. With this arrangement, the surge resistance of the bonding portion is increased, and deformation and rupture of a wire can be prevented. Therefore, all the above-described problems associated with the wire connection method can be solved.

Since connection is enabled by twisting the inner lead of the lead frame, the inner lead can be connected to a predetermined position by using only one lead frame without scratching the semiconductor pellet. Hence, the material cost for the lead frame is reduced. The transfer speed can be increased as compared to the full inversion process. Automation can be easily realized. The dimensions of the mold package can be reduced, and the mounting area can be reduced by about 30%.

The projecting portion of the inner lead can be formed simultaneously when the lead frame with the leads and feeding holes is formed by pressing or etching the lead frame plate material. For this reason, the semiconductor device can be easily manufactured without any special manufacturing process.

Since the projecting portion is formed on the inner lead side, the projecting electrode such as a bump need not be formed on the semiconductor pellet side. Even a pellet electrode consisting of a normal conductive thin film can be bonded to the inner lead, so that the semiconductor device can be manufactured at a low cost.

Plating associated with bonding to the pellet electrode is needed for only one surface of the lead frame, resulting in a decrease in material cost. This also enables to manufacture the semiconductor device at a low cost.

The above and many other advantages, features and additional objects of the present invention will become manifest to those versed in the art upon making reference to the following detailed description and accompanying drawings in which preferred embodiments incorporating the principles of the present invention are shown by way of illustrative example.

DETAILED DESCRIPTION OF THE PREFERRED EMBODIMENT

A preferred embodiment of the present invention will be described below with reference to the accompanying drawings (FIGS. 8A to 13).

Figure 8A:
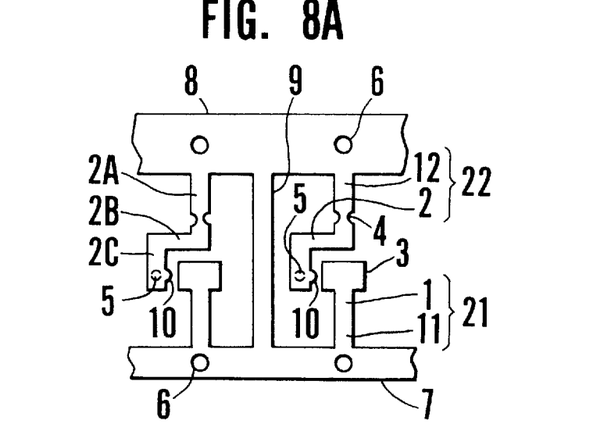
FIGS. 8A to 8C are plan views showing steps in the manufacture of a semiconductor device using a lead frame according to an embodiment of the present invention.
Figure 8B:
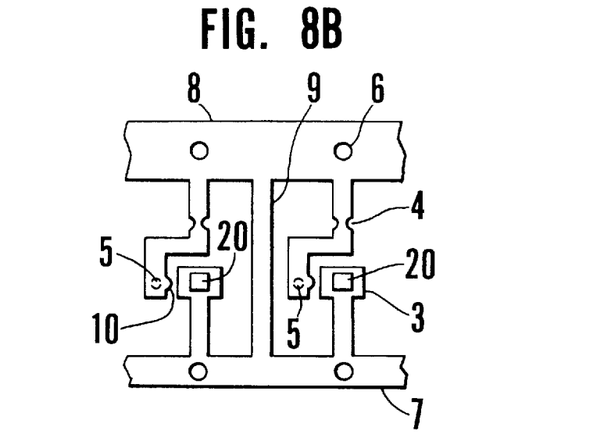
Figure 8C:
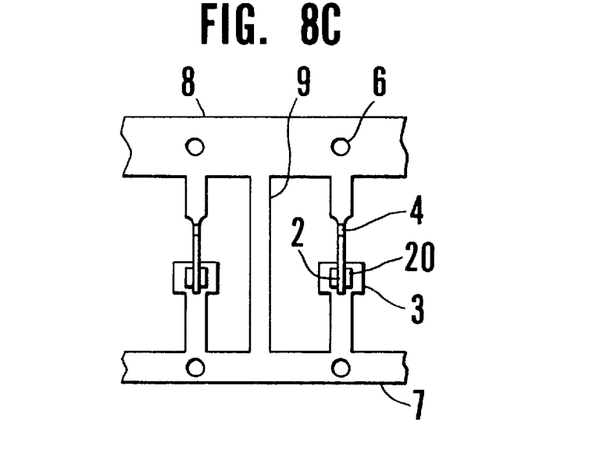

FIGS. 8A to 8C are schematic plan views showing steps in the manufacture of a semiconductor device using a lead frame according to an embodiment of the present invention.

As shown in FIG. 8A, in a lead frame consisting of a copper-based plate member, a support frame 7 having guide holes 6 for positioning and conveyance is coupled to a support frame 8 having guide holes 6 for positioning and conveyance through a tie bar 9 such that the support frames 7 and 8 are separated at a predetermined interval and parallel to each other. Leads 21 each consisting of an inner lead 1 and an outer lead 11 are connected to the support frame 7. An island 3 on which a semiconductor pellet is to be mounted is formed at the distal end portion of the inner lead 1. Leads 22 each consisting of an inner lead 2 and an outer lead 12 are connected to the support frame 8. In each lead, a portion which is positioned in a resin material after encapsulation with the resin material is the inner lead, and a portion outside the resin material is the outer lead.

The inner lead 2 of each lead 22 connected to the support frame 8 has a first portion 2A extending from the outer lead 12 side toward the support frame 7, a second portion 2B bent at the first portion 2A at right angles to extend parallel to the support frames 7 and 8, and a third portion 2C bent at right angles again from the second portion 2B to extend toward the support frame 7. A constricted portion 4 is formed at a predetermined portion of the first portion 2A. A projecting portion 10 (projecting portion in a plan view) is formed to project from the distal end portion of the third portion 2C, i.e., a side surface of the distal end portion of the inner lead 2, which opposes the island 3, toward the island 3. A recessed portion 5 is formed in the flat surface of the inner lead 2 near the projecting portion 10.

The constricted portion 4 is formed to bend the remaining portion of the inner lead 2 at right angles in the direction coming out of the page. The projecting portion 10 is formed to be connected to the upper-surface pellet electrode of the semiconductor pellet. The recessed portion 5 is formed to deposit connecting solder therein.

More specifically, the main purpose of forming the constricted portion 4 is to minimize deformation which may affect the remaining lead portion when the inner lead is twisted and connected to the upper-surface pellet electrode of the semiconductor pellet, or minimize residual stress after the twisting process. Before connection, solder is deposited in advance at the distal end portion of the inner lead 2. The recessed portion 5 is formed to deposit the solder in a necessary amount.

Figure 11:
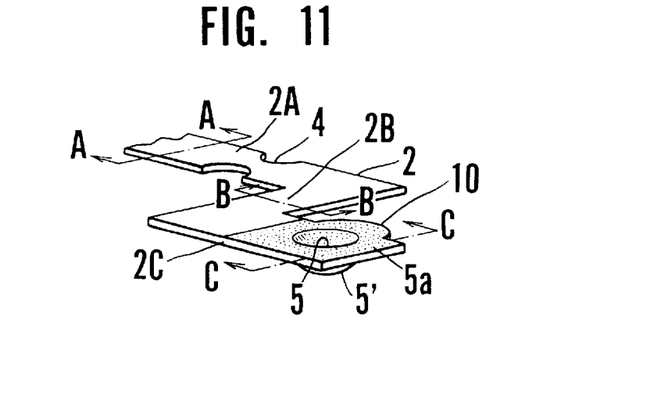
FIG. 11 is a schematic perspective view showing a state after plating is performed for the main portion of an inner lead used in the embodiment of the present invention.

As shown in the perspective view of FIG. 11, only the recessed portion 5 and a portion around the recessed portion 5 are subjected to plating with a good adhesion to the solder in advance. This plating is performed for only a hatched portion in FIG. 11, i.e., for only a surface on which the recessed portion 5 at the distal end portion is formed, so that the plating cost can be reduced. Since the recessed portion 5 in FIG. 11 is formed by embossing, a projecting portion 5' is formed on the lower surface.

The lead is flat and has rectangular sections in the extending direction and in a direction perpendicular to the extending direction. In FIG. 11, sections taken along lines A—A, B—B, and C—C are rectangular. In these rectangles, the pairs of long sides correspond to the pairs of major surfaces (upper and lower surfaces) of the first portion 2A, the second portion 2B, and the third portion 2C, respectively, and the pairs of short sides correspond to the thickness of the lead.

More specifically, the projecting portion 10 projecting from one side surface of the third portion 2C has the same thickness as those of the remaining portions, and the recessed portion 5 is formed on one major surface (upper surface).

In the conventional lead frame manufacturing process, i.e., in forming the lead, tie bar, support frame, and guide hole portions from a lead frame plate member by pressing or etching, the projecting portion 10 and the recessed portion 5 can be easily formed together with these portions. That is, no special process is required to form the projecting portion 10 and the recessed portion 5, so the number of manufacturing steps do not increase for the purpose of forming the projecting portion 10 and the recessed portion 5.

As shown in FIG. 8B, a semiconductor pellet 20 is mounted on the island 3 of the above-described lead frame of the present invention. This process is performed such that the lower surface of the semiconductor pellet 20 is bonded to the island 3 with an adhesive, e.g., silver paste.

Figure 12:
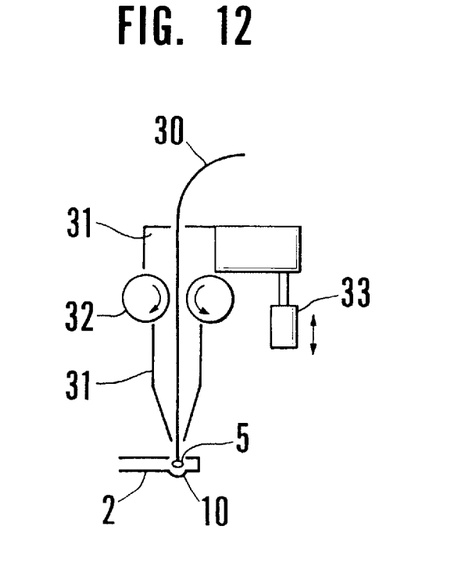
FIG. 12 is a schematic front view showing an example of a solder supply unit used in the embodiment of the present invention.

Thereafter, e.g., eutectic Sn—Pb solder is deposited in the recessed portion 5 by using a solder supply unit as shown in FIG. 12. More specifically, a solder wire 30 is fed by rollers 32 through a nozzle 31 which can be driven in the vertical direction by a nozzle elevating cylinder 33. The solder wire abuts against the heated recessed portion 5 at the distal end portion of the inner lead and is deposited therein.

Figure 13:
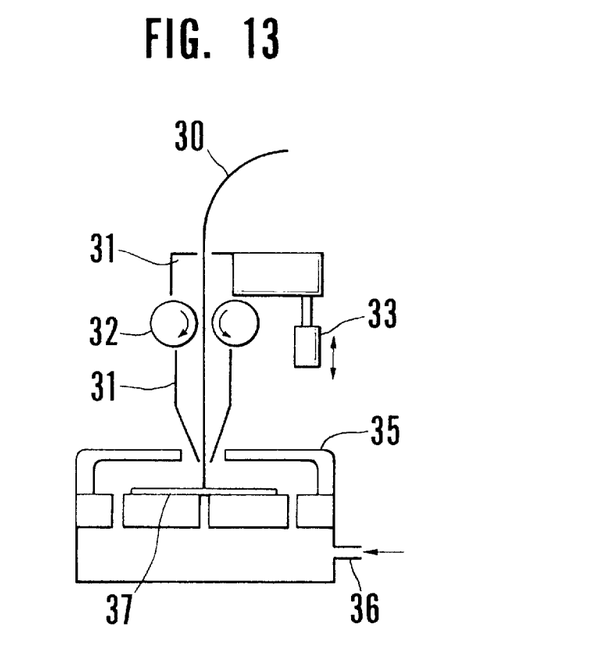
FIG. 13 is a schematic front view showing another example of the solder supply unit used in the embodiment of the present invention.

Alternatively, instead of plating, solder is deposited in an atmosphere for preventing oxidation, as shown in FIG. 13. More specifically, in the unit shown in FIG. 13, a lead frame 37 is covered with a gas cover 35. Solder is deposited while the gas cover 35 is filled with an inert gas such as nitrogen introduced from a gas inlet port 36 on the lower side.

By either method, solder can be selectively deposited in a necessary amount in the recessed portion 5.

Thereafter, as shown in FIG. 8C, the inner lead 2 is twisted at the constricted portion 4, thereby setting the projecting portion 10 close to the upper-surface pellet electrode from the upper surface side (from the upper side) of the semiconductor pellet 20.

Figure 9A:
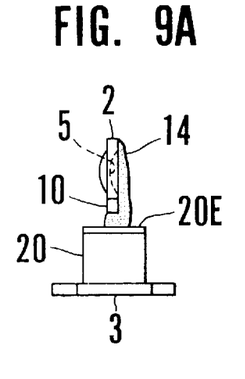
FIGS. 9A and 9B are a schematic front view and a schematic side view, respectively, showing a main portion obtained upon a heat treatment after FIG. 8C.
Figure 9B:
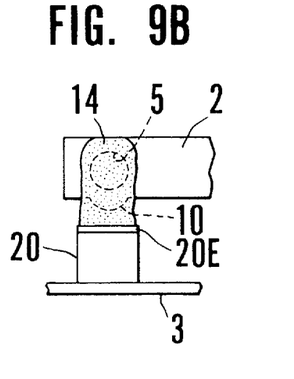

A heat treatment is performed to melt solder 14 deposited at the distal end portion of the inner lead 2 in advance, as shown in the front view of FIG. 9A and the side view of FIG. 9B. The molten solder 14 drops along the projecting portion 10 and contacts an upper-surface pellet electrode 20E of the semiconductor pellet 20 below. The solder 14 holds a so-called bridge state because of its surface tension. The solder cools down and solidifies so that the inner lead 2 and the upper-surface pellet electrode 20E of the semiconductor pellet 20 are connected to each other. This upper-surface pellet electrode 20E is a normal bonding pad having a flat surface and formed by a metal film of a wiring layer material or the like. That is, the semiconductor pellet need not have a projection electrode such as a bump electrode because the projecting portion is formed on the lead side.

Figure 10:
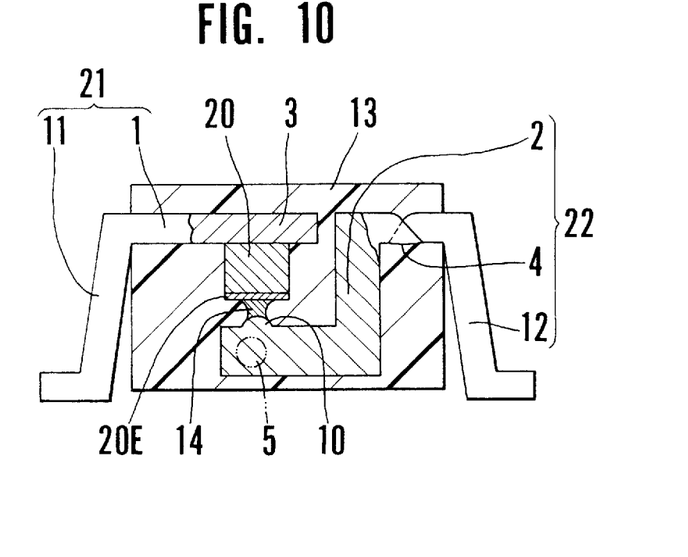
FIG. 10 is a schematic longitudinal sectional view showing a semiconductor device according to an embodiment of the present invention.

As shown in FIG. 10, the inner leads 1 and 2 including the semiconductor pellet 20 are encapsulated with a resin material 13. The outer leads 11 and 12 extending from the resin material 13 are cut off from the support frames 7 and 8, respectively. The outer leads 11 and 12 are bent and formed, thereby obtaining a semiconductor device according to the embodiment of the present invention.

The embodiment of the present invention has been described above with reference to Figs. BA to 13. However, the present invention is not limited to the above embodiment, and various changes and modifications can be made, as a matter of course.

In the manufacturing process according to the above embodiment of the present invention, when the inner lead 2 and the semiconductor pellet 20 are to be bonded with solder, the solder is deposited on the inner lead 2 in advance, and then the solder is heated and molten. However, bonding can be performed without depositing solder in advance. That is, plating with excellent wettability to solder is performed for only the recessed portion 5 at the distal end portion of the inner lead 2, and the distal end portion is immersed in a solder melt tank. In this case, the atmosphere for preventing oxidation is unnecessary. In this method of immersing the structure in the solder melt tank, particularly, plating must be partially performed, as shown in FIG. 11. Full plating is not preferable because the solder may adhere to an unnecessary portion. According to an experiment, no problem was posed even when the structure was entirely immersed in the solder tank after a semiconductor pellet was mounted.

Even when plating is performed for only the recessed portion 5 but not for the side surface of the projecting portion 10, connection to the pellet electrode can be performed without any problem because of the surface tension.

In the above embodiment, the inner lead and the upper-surface pellet electrode of the semiconductor pellet are connected using solder. However, instead of a so-called solder alloy, a low-melting conductive material, i.e., a low-melting metal such as tin may be used.

In the above embodiment, one lead frame is used. However, the present invention can be applied to even a plurality lead frames. In addition, the material of the lead frame is not limited to a copper-based plate member, and another material, e.g., an iron-based plate member can be used.

The projecting portion of the inner lead 2 has a semi-spherical shape. However, another shape may be formed as far as the molten solder can drop along the projecting portion.

The inner lead 2 is twisted at a twisting angle of 90°. However, another twisting angle may be employed as far as the bonding portion comes close to the pellet electrode.

The inner lead 2 has an isolated recessed portion where solder is deposited. However, a groove-like recessed portion or a hole may be formed.

Although not specified in the above embodiment, when a heating process in the manufacturing process is performed in an atmosphere of a reducing gas or an inert gas, more satisfactory bonding can be achieved.

In the above embodiment, a two-terminal type semiconductor device has been described. However, the present invention can also be applied a semiconductor device having three or more terminals.

What is claimed is:

1. A semiconductor device in which a flat inner lead is connected to a semiconductor pellet, said flat inner lead comprising two relatively larger opposing flat surfaces and two relatively smaller opposing side edges, wherein one said side edge of said inner lead is connected to said semiconductor pellet.

2. A device according to claim 1, wherein said inner lead has a constricted portion where said inner lead is twisted about 90° so that said one side edge faces a surface of the pellet to which said inner lead is connected.

3. A device according to claim 1, wherein said one side edge comprises a projecting portion that is connected to said semiconductor pellet.

4. A device according to claim 1, wherein a recessed portion for holding solder in a predetermined amount is in one said flat surface of a distal end portion of said inner lead connected to said semiconductor pellet.

5. A lead frame comprising a first inner lead having an island on which a semiconductor pellet is to be mounted, and a second inner lead that has two relatively larger opposing flat surfaces and two relatively smaller opposing side edges, wherein one of said side edges is to be connected to a pellet electrode of the semiconductor pellet, wherein said one side edge at a distal end portion of said second inner lead facing said island of said first inner lead comprises a projecting portion.

6. A lead frame according to claim 5, wherein a a predetermined portion of said second inner lead is constricted.

7. A flat lead frame comprising a first support frame, a second support frame separated from said first support frame at a predetermined interval and extending parallel to said first support frame, a first lead integrally connected to said first support frame and having a first outer lead and a first inner lead with an island formed at a distal end portion, and a second lead integrally connected to said second support frame and having a second outer lead and a second inner lead, wherein said second inner lead comprises two relatively larger opposing flat surfaces and two relatively smaller opposing side edges, said second inner lead further having a first portion extending from said second outer lead toward said first support frame, a second portion extending from an end portion of said first portion substantially parallel to said first and second support frames, and a third portion extending from an end portion of said second portion toward said first support frame so as to have one said side edge facing said island, wherein a predetermined portion of said first portion is constricted, and wherein said one side edge comprises a projecting portion projecting toward said island.

8. A lead frame according to claim 7, wherein one of a recessed portion and a through hole is formed in a flat surface of said third portion near said projecting portion.

9. A lead frame according to claim wherein only one said flat surface of said third portion is plated.

10. The device according to claim 1, wherein a flat surface of said inner lead remote from the pellet is generally parallel to a surface of said side edge adjacent the pellet.

* * * * *